United States Patent
Witcraft et al.

(10) Patent No.: US 6,700,371 B2
(45) Date of Patent: Mar. 2, 2004

(54) THREE DIMENSIONAL CONDUCTIVE STRAP FOR A MAGNETORESTRICTIVE SENSOR

(75) Inventors: William F. Witcraft, Minneapolis, MN (US); Joon-Wong Kang, Redmond, WA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/947,076

(22) Filed: Sep. 5, 2001

(65) Prior Publication Data

US 2003/0042900 A1 Mar. 6, 2003

(51) Int. Cl.[7] ............................................. G01R 33/002
(52) U.S. Cl. ..................... 324/252; 324/235; 338/32 R
(58) Field of Search ................................ 324/252–260, 324/207.21, 244, 249, 228, 235; 338/32 H, 32 R; 257/421–427, 43.001–43.007

(56) References Cited

U.S. PATENT DOCUMENTS

| 4,847,584 | A | * | 7/1989 | Pant ........................ 338/32 R |
| 4,860,138 | A |   | 8/1989 | Vinal et al. |
| 5,247,278 | A | * | 9/1993 | Pant et al. ................. 338/32 R |
| 5,500,590 | A | * | 3/1996 | Pant ............................. 324/252 |
| 5,561,368 | A | * | 10/1996 | Dovek et al. ................ 324/252 |
| 5,831,426 | A |   | 11/1998 | Black, Jr. et al. |
| 5,831,431 | A |   | 11/1998 | Gottfried-Gottfried et al. |
| 5,929,636 | A | * | 7/1999 | Torok et al. ................. 324/252 |
| 5,952,825 | A | * | 9/1999 | Wan ............................ 324/252 |
| 6,411,086 | B1 | * | 6/2002 | Choi et al. ................... 324/253 |

FOREIGN PATENT DOCUMENTS

| DE | 3420709 A1 | 12/1985 |
| GB | 2 064 140 A | 6/1981 |

OTHER PUBLICATIONS

International Search Report, date of mailing Dec. 5, 2002. PCT/US02/28239.

* cited by examiner

Primary Examiner—N. Le
Assistant Examiner—Reena Aurora
(74) Attorney, Agent, or Firm—Schiff Hardin LLP

(57) ABSTRACT

A magnetoresistive sensor has a semiconductor substrate and an insulator over the substrate. A magnetoresistive film is embedded in the insulator responsive material, and a conductive strap is wound into a coil around the magnetoresistive film but not around the substrate.

19 Claims, 2 Drawing Sheets excellent# THREE DIMENSIONAL CONDUCTIVE STRAP FOR A MAGNETORESTRICTIVE SENSOR

RELATED APPLICATION

U.S. patent application Ser. No. 09/908,835 filed Jul. 19, 2001 discloses subject matter which is similar to the subject matter disclosed herein.

TECHNICAL FIELD OF THE INVENTION

The present invention relates in general to magnetic field sensors and, more particularly, to magnetoresistive sensors.

BACKGROUND OF THE INVENTION

Magnetoresistive sensors are typically small, and generally measure magnetic fields on the order of 0.001 gauss to 100 gauss. Also, magnetoresistive sensors are able to measure D.C. fields as well as fields having frequencies up to and exceeding one megahertz. Accordingly, magnetoresistive sensors are used in a wide variety of applications such as current sensing, proximity sensing, etc.

The magnetoresistive material used in making magnetoresistive sensors is a material whose resistance changes in the presence of a magnetic field. Permalloy, which is a nickle/iron alloy, is such a material and is often provided as a film in a layer above an integrated circuit wafer. The resistance of the film varies according to the square of the cosine of the angle between the magnetization direction of the film and the direction of the current running along the length of the film. When the magnetization of the film is parallel to the current, the resistance of the film is at a maximum. On the other hand, when the magnetization of the film is perpendicular to the current, the resistance of the film is at a minimum.

The response of a magnetoresistive material is measured as $\Delta R/R_N$, where $\Delta R$ is the change in resistance of the magnetoresistive material and $R_N$ is the nominal resistance of the magnetoresistive material. The change in the resistance $\Delta R$ of Permalloy between the point where the magnetization direction is parallel to the current direction and the point where the magnetization direction is perpendicular to the current direction is typically on the order of 2% of the nominal resistance of the material.

Moreover, the plot of $\Delta R/R_N$ versus the angle between the magnetization direction and the current direction is bell shaped. In order to operate the magnetoresistive material on the linear part of this curve, a bias field is frequently applied to the magnetoresistive sensor. For example, either a solenoid wrapped around the magnetoresistive sensor package or a plurality of thin-film permanent magnets at the end of the magnetoresistive sensor are usually used to apply an external biasing field so as to bias the magnetoresistive material at this linear portion.

Alternatively, instead of applying an external biasing field, it is known to apply an internal biasing field to the magnetoresistive sensor. Accordingly, the magnetoresistive sensor is provided with a conductive strap, which is usually referred to as a set/reset strap. A set-reset strap is fabricated using known integrated circuit processing techniques to form a serpentine conductor typically in a layer above the magnetoresistive film. A current may be applied in either direction through the set/reset strap so as to selectively bias the magnetization direction of the magnetoresistive film.

This set/reset strap may also be used as an offset strap to eliminate the offset due to mismatched magnetoresistive bridge elements and due to temperature differences between magnetoresistive films when several magnetoresistive films are arranged in a bridge configuration in a single sensor structure. The offset strap can also be used to eliminate offset drift in the bridge measurement electronics.

As indicated above, known set, reset, and/or offset straps meander in a single plane or layer of a magnetic device such as a magnetoresistive sensor. Accordingly, when multiple magnetic devices are formed on a semiconductor wafer, a substantial amount of the wafer real estate is used to form the strap, which imposes a restriction on the number of magnetic devices that can be formed on the wafer. Moreover, known set, reset, and/or offset straps which meander in a single plane or layer of a wafer require a relatively large current flow to produce the required magnetic field.

The present invention is directed, at least in one embodiment, to a strap which overcomes one or more of the problems noted above.

SUMMARY OF THE INVENTION

In accordance with one aspect of the present invention, a magnetic sensor comprises a semiconductor substrate, a magnetically responsive material formed above the semiconductive substrate, and a conductive strap wound into a coil around the magnetically responsive material such that at least a portion of the conductive strap is between the magnetically responsive material and the substrate.

In accordance with another aspect of the present invention, a magnetoresistive sensor comprises a semiconductor substrate, an insulator over the substrate, a magnetoresistive film embedded in the insulator responsive material, and a conductive strap wound through the insulator so as to form a coil around the magnetoresistive film.

In accordance with yet another aspect of the present invention, a magnetoresistive sensor comprises a semiconductor substrate, a magnetoresistive material, and a three-dimensional conductive strap. The magnetoresistive material is formed above the semiconductive substrate. The three-dimensional conductive strap is formed above the semiconductive substrate, and has a position with respect to the magnetoresistive material so as to set the magnetization direction of the magnetoresistive material when the three-dimensional conductive strap is supplied with current.

BRIEF DESCRIPTION OF THE DRAWINGS

These and other features and advantages will become more apparent from a detailed consideration of the invention when taken in conjunction with the drawing in which.

DETAILED DESCRIPTION

Figure 1:
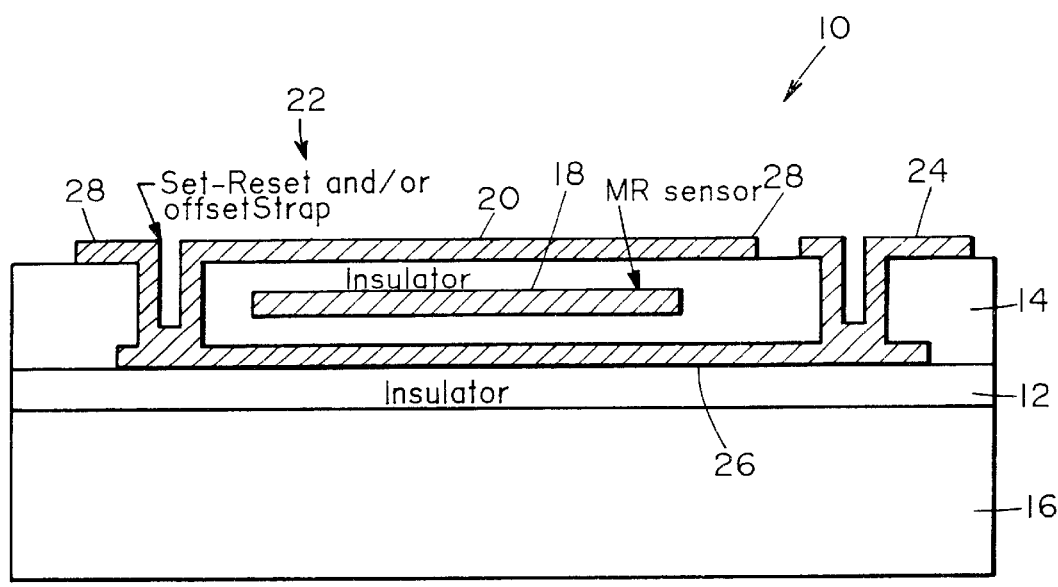
FIG. 1 is a cross-sectional side view of a magnetoresistive sensor according to an exemplary embodiment of the present invention; and, FIG. 2 is a top view of the magnetoresistive sensor of FIG. 1.
Figure 2:
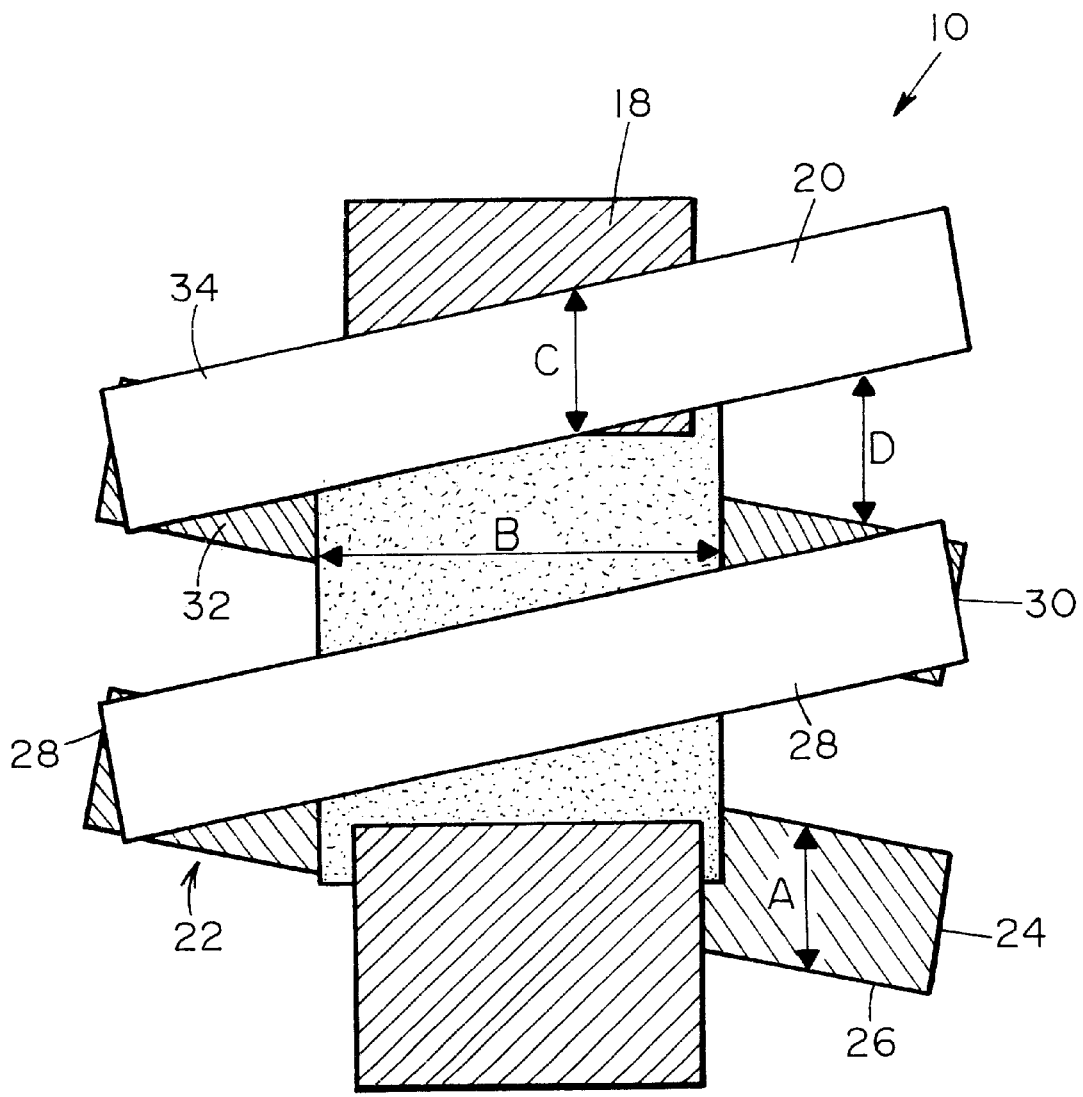

As shown in FIGS. 1 and 2, a magnetoresistive sensor 10 includes first and second insulators 12 and 14 formed over a substrate 16. For example, the material of the first and second insulators 12 may be silicon dioxide or a thermal oxide, and the substrate 16 may be silicon.

A magnetoresistive film 18 is embedded in the second insulator. Because the view of FIG. 1 is an end view, the length of the magnetoresistive film 18 goes into the page as the reader observes FIG. 1. The resistance of the magnetoresistive film 18 is dependent upon the magnetic field to which the magnetoresistive sensor 10 is exposed. Permalloy or other magnetoresistive material may be used for the magnetoresistive film 18. For example, the magnetoresistive film 18 may have a thickness of 175 Å, and a length to width ratio of 16/1. However, it should be understood that these dimensions are exemplary only and that they are application dependent. Different dimensions may be used depending on the required sensitivity of the magnetoresistive sensor 10.

A conductive strap 20 is formed into a coil 22 around the magnetoresistive film 18. As viewed in FIG. 1, the turns of the coil 22 travel into the page as they spiral around the magnetoresistive film 18. Copper, aluminum, a copper/aluminum alloy, or other non-magnetic conductive material may be used for the conductive strap 20. For example, the conductive strap 20 may have a thickness of 2 microns, and a width of 20 microns, and a length sufficient to form a coil around the magnetoresistive film 18. However, it should be understood again that these dimensions are exemplary only and that they are application dependent. The first and second insulators 12 and 14 should have a thickness sufficient to electrically insulate the magnetoresistive film 18 and the conductive strap 20 from each other and from the substrate 16.

The first turn of the coil 22 begins with a first segment 24 of the conductive strap 20 that passes through the second insulator 14 to contact a second segment 26 of the conductive strap 20. The second segment 26 of the conductive strap 20 is buried between the first and second insulators 12 and 14, traverses the width of the magnetoresistive film 18, and contacts a third segment 28 of the conductive strap 20. The third segment 28 of the conductive strap 20 passes through the second insulator 14 to contact the second segment 26, and also travels along the surface of the second insulator 14 to complete the first turn of the coil 22.

A second turn of the coil 22 begins with a fourth segment 30 of the conductive strap 20 that contacts the end of the third segment 28 of the conductive strap 20 but does not contact the first and second segments 24 and 26 of the conductive strap 20. The fourth segment 30 of the conductive strap 20 passes through the second insulator 14 to contact a fifth segment 32 of the conductive strap 20. The fifth segment 32 of the conductive strap 20 is buried between the first and second insulators 12 and 14, traverses the width of the magnetoresistive film 18 behind the second segment 26 of the conductive strap 20, and contacts a sixth segment 34 of the conductive strap 20 which is behind the third segment 28 of the conductive strap 20. The sixth segment 34 of the conductive strap 20 passes through the second insulator 14 to contact the fifth segment 32, and also travels along the surface of the second insulator 14 behind the third segment 28 to complete the second turn of the coil 22. Accordingly, none of the segments of the second turn of the coil 22 contact any of the segments of the first turn of the coil 22, except that the end of the third segment 28 contacts the beginning of the fourth segment 30.

Any remaining turns of the coil 22 are similarly formed.

Because the conductive strap 20 is wound into the coil 22 around the magnetoresistive film 18 in all three dimensions (x, y, and z), the resulting magnetoresistive sensor is smaller than when a known single plane or layer set/reset and offset strap is used. Accordingly, when multiple magnetic devices are formed on a semiconductor wafer, the conductive strap 20 of the present invention permits more magnetic devices to be formed on a wafer than do known set/reset and offset straps. Thus, the conductive strap 20 of the present invention reduces fabrication costs.

Moreover, the coil 22 formed by the three dimensional winding of the conductive strap 20 produces about twice as much magnetic field for the same current as do known set/reset and offset straps that meander in a single plane or layer of a wafer. Alternatively, the coil 22 formed by the three dimensional winding of the conductive strap 20 produces about the same magnetic field at half the current as do known set/reset and offset straps that meander in a single plane or layer of a wafer. The use of less current produces less thermal stress on the conductive strap 20.

As shown in FIG. 2, dimension A=20 microns, dimension B=15 microns, dimension C=20 microns, and dimension D=20–40 microns depending on number of turns. However, it should be understood yet again that these dimensions are exemplary only and that they are application dependent.

Certain modifications of the present invention will occur to those practicing in the art of the present invention. For example, the present invention has been described above in terms of a magnetoresistive sensor. However, the present invention may be used with other types of magnetic sensors.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

What is claimed is:

1. A magnetic sensor comprising:
   a semiconductor substrate;
   a magnetoresistive material formed above the semiconductive substrate, wherein the magnetoresistive material has opposing first and second surfaces, and wherein the first surface faces the semiconductor substrate; and
   a set-reset strap wound into a coil around the magnetoresistive material such that a first portion of the set-reset strap is below the first surface, such that the first portion is between the magnetoresistive material and the substrate, and such that a second portion of the set-reset strap is above the second surface.

2. The magnetic sensor of claim 1 wherein the set-reset strap comprises a plurality of segments forming the coil.

3. The magnetic sensor of claim 2 wherein the segments consist of horizontal and vertical segments.

4. The magnetic sensor of claim 1 wherein the set-reset strap comprises a non-magnetic conductive material.

5. The magnetic sensor of claim 1 wherein the set-reset strap comprises copper.

6. The magnetic sensor of claim 1 wherein the set-reset strap comprises aluminum.

7. The magnetic sensor of claim 1 wherein the set-reset strap comprises a copper/aluminum alloy.

8. The magnetic sensor of claim 1 further comprising an insulator, wherein the magnetoresistive material is embedded in the insulator.

9. The magnetic sensor of claim 8 wherein the conductive strap comprises a non-magnetic conductive material.

10. A method of biasing a magnetic sensor having a semiconductor substrate, a magnetoresistive material, and a set-reset strap, the magnetoresistive material formed above the semiconductive substrate, the magnetoresistive material having opposing first and second surfaces, the first surface facing the semiconductor substrate, the set-reset strap being wound into a coil around the magnetoresistive material such that a first portion of the set-reset strap is below the first surface, such that the first portion is between the magnetoresistive material and the substrate, and such that a second portion of the set-reset strap is above the second surface, the method comprising:

supplying a signal to the set-reset strap; and, controlling the signal so as to bias the magnetoresistive material in a selected magnetization direction.

11. The method of claim 10 wherein the set-reset strap comprises a plurality of horizontal and vertical segments forming the coil.

12. The method of claim 10 wherein the set-reset strap comprises a non-magnetic conductive material.

13. The method of claim 10 wherein the magnetic sensor further comprises an insulator, and wherein the magnetoresistive material is embedded in the insulator.

14. The method of claim 13 wherein the conductive strap comprises a non-magnetic conductive material.

15. A magnetoresistive sensor comprising:

a semiconductor substrate;

a magnetoresistive material formed above the semiconductive substrate; and, a three-dimensional set-reset strap having a first portion in a first layer between the semiconductive substrate and the magnetoresistive material and a second portion formed in a second layer so that the magnetoresistive material is between the first and second layers, wherein the three-dimensional set-reset strap has a position with respect to the magnetoresistive material so as to set the magnetization direction of the magnetoresistive material when the three-dimensional set-reset strap is supplied with current.

16. The magnetoresistive sensor of claim 15 wherein the set-reset strap comprises a plurality of segments in multiple layers so as to form a coil around the magnetoresistive material.

17. The magnetoresistive sensor of claim 16 wherein the segments comprise substantially linear, elongated portions.

18. The magnetoresistive sensor of claim 15 wherein the set-reset strap comprises a non-magnetic conductive material.

19. The magnetoresistive sensor of claim 15 further comprising an insulator, wherein the magnetoresistive material is embedded in the insulator.

* * * * *